United States Patent [19]
Mish

[11] Patent Number: 6,077,106
[45] Date of Patent: Jun. 20, 2000

[54] THIN PROFILE BATTERY MOUNTING CONTACT FOR PRINTED CIRCUIT BOARDS

[75] Inventor: William Mish, Boise, Id.

[73] Assignee: Micron Communications, Inc., Boise, Id.

[21] Appl. No.: 08/869,441

[22] Filed: Jun. 5, 1997

[51] Int. Cl.[7] .................................................. H01R 3/00
[52] U.S. Cl. ........................................ 439/500; 361/761
[58] Field of Search .................... 439/500, 68; 361/7.61; 429/100

[56] References Cited

U.S. PATENT DOCUMENTS

| | | | |
|---|---|---|---|
| 4,653,822 | 3/1987 | Kanazawa | 439/500 |
| 5,229,641 | 7/1993 | Katayama | 257/678 |
| 5,300,875 | 4/1994 | Tuttle | 320/20 |
| 5,323,150 | 6/1994 | Tuttle | 340/825.54 |
| 5,326,652 | 7/1994 | Lake | 429/127 |
| 5,486,431 | 1/1996 | Tuttle et al. | 429/66 |
| 5,497,140 | 3/1996 | Tuttle | 342/51 |
| 5,528,463 | 6/1996 | McLellan et al. | 361/785 |
| 5,530,702 | 6/1996 | Palmer et al. | 370/85.3 |
| 5,550,547 | 8/1996 | Chan et al. | 342/42 |
| 5,558,679 | 9/1996 | Tuttle | 29/623.1 |
| 5,558,957 | 9/1996 | Datta et al. | 429/127 |
| 5,572,226 | 11/1996 | Tuttle | 343/726 |
| 5,604,485 | 2/1997 | Lauro et al. | 340/572 |
| 5,604,486 | 2/1997 | Lauro et al. | 340/572 |

*Primary Examiner*—Neil Abrams
*Assistant Examiner*—Javaid Nasri
*Attorney, Agent, or Firm*—Trask, Britt & Rossa

[57] ABSTRACT

A battery mounting contact consists of a substrate having a battery cavity for housing a battery therein. A first contact is attached to a first surface of the substrate and extends over the battery cavity substantially planarly adjacent to the substrate first surface. A second contact extends over the battery cavity substantially planarly adjacent to a second surface of the substrate. The battery, disposed within the battery cavity, makes electrical contact by its anode with the first contact and by its cathode with the second contact, or vis versa. The battery mounting contact significantly reduces the thickness of a battery powered device.

30 Claims, 3 Drawing Sheets

THIN PROFILE BATTERY MOUNTING CONTACT FOR PRINTED CIRCUIT BOARDS

BACKGROUND OF THE INVENTION

1. Field of the Invention

The present invention relates to battery mounting contacts. More particularly, the present invention relates to thin profile battery contacts for active tags used in active radio frequency identification and methods of producing the same.

2. State of the Art

Identification and tracking of objects are important concerns for most business operations. Presently, a leading method of object identification is bar code reading. Multiple objects can be identified by checking each object individually using a bar code reader which reads a bar code attached to each object. Although using bar codes on objects is a great advancement over manually and individually identifying objects, the bar code reading process is still time consuming and is also subject to bar code damage and bar code reader error. Furthermore, bar code readers usually require human operation wherein a person passes the bar code affixed to the object over the bar code reader, or passes the bar code reader over the bar code. Such human operation also introduces human error into the bar code reading process.

With such problems in bar code reading for identification, radio frequency identification (hereinafter "RF-ID") is rapidly becoming an important object identification method. The most important component of an RF-ID system is an information carrying tag which is affixed to the object. The information carrying tag functions in response to a coded radio frequency (hereinafter "RF") signal which the tag receives from a base station. In a passive information carrying tag, the tag receives its energy from the base station RF signal and reflects an RF carrier signal back to the base station. An active information carrying tag (hereinafter "active tag") contains a battery. The battery allows the active tag to retain, modify, and send information contained on the information carrying tag in response to the base station RF signal.

The active tag generally consists of a semiconductor chip having RF circuits, logic circuits, and memory. The active tag also has an antenna, a battery, a substrate for mounting the components, interconnections between components, and a physical enclosure, such as a plastic encasement or lamination.

In a typical configuration, the base station has a computer section which issues commands to an RF transmitter and receives commands from the RF receiver. The base station antenna sends RF signals to and receives RF signals from one or more active tags within the RF signal range, generally about 50 feet.

These active tags can be attached to articles of varying shapes and sizes and can be used in applications such as merchandise identification, item delivery control (letters and packages), inventory control and tracking, container control and tracking, surveillance, telemetry, automatic toll collection, and monitoring the location of vehicles and personnel.

As previously discussed, active tags require a battery. The functional specifications of the battery include a nominal cell voltage (typically 3 volts), high energy density and specific energy. Such specifications generally exist in lithium batteries. Furthermore, the battery must have a very thin profile in order to manufacture active tags which are unobtrusive and/or which can be used with a credit or debit card.

FIG. 8 illustrates a typical surface mount battery contact configuration 300. A battery 302, having a first contact surface 304 and a second contact surface 306, is positioned to contact the battery second contact surface 306 with a second contact 312 which is mounted on a substrate 310. A first contact 308 contacts the battery first contact surface 304. The first contact 308 typically has a battery contact portion 314 which extends over the battery 302 to contact the battery first contact surface 304, and a battery attachment portion 316 which is attached to the substrate 310. The battery first contact surface 304 may be an anode and the battery second contact surface 306 may be a cathode, or vice versa. The first contact 308 and the second contact 312 have conductive traces or the like (not shown) electrically connecting the first and second contacts 308, 312 to other active tag components (not shown). Although this surface mount battery contact configuration 300 is useful for some semiconductor applications or the like, it is not conducive to most active tag applications. The combined height of the substrate 310, the first contact 308, the battery 302, and the second contact 312 is too thick for most active tag applications.

U.S. Pat. No. 5,558,957 issued Sep. 24, 1996 to Datta et al. teaches a method for making a thin flexible battery for microelectronics applications. However, a flexible battery requires specialized manufacturing techniques, which would increase the cost of the active tags.

Therefore, it would be advantageous to develop an apparatus for mounting a commercially-available, inexpensive, thin lithium battery on a substrate while achieving a thin overall active tag profile without requiring complex processing steps or expensive components.

SUMMARY OF THE INVENTION

The present invention relates to a novel battery mounting contact and mounting technique. The battery mounting contact includes a substrate having a battery cavity defined therein which is slightly larger than the size of a predetermined battery to be mounted. A first contact is attached to a first surface of the substrate and extends over the battery cavity substantially planarly adjacent to the substrate first surface. A second contact extends over the battery cavity substantially planarly adjacent to a second surface of the substrate. The second contact may be attached to the substrate first surface wherein a portion of the second contact would extend through the battery cavity and align substantially planarly adjacent to the substrate second surface, or the second contact may be attached to the substrate second surface and extend over the battery cavity. The first contact and the second contact are each in electrical communication with separate conductive traces or the like which are, in turn, in electrical communication with circuitry on the substrate. The circuitry may include RF circuits, logic circuits, memory, and an antenna.

A battery, having a first contact surface and a second contact surface, is disposed within the battery cavity between the first contact and the second contact. The battery first contact surface makes electrical contact with the first contact and the battery second contact surface makes electrical contact with the second contact. The battery first contact surface may comprise an anode and the battery second contact surface may comprise a cathode, or vice versa.

By mounting the battery in such a manner, at least partially contained within the substrate depth, the thickness of the substrate no longer contributes to the overall height of the assembly because the thickness of the substrate can generally be reduced below the thickness of the battery.

Although the present invention is directed to RF-ID tags, the battery mounting contact may be used in a variety of the applications which require a thin profile such as: PCMCIA cards, cellular phones, video game cartridges, pagers, and the like. Furthermore, the present invention is useful for applications with thickness limitations such as credit cards or "smart cards" which need to have a thickness of 0.039 inches or less.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
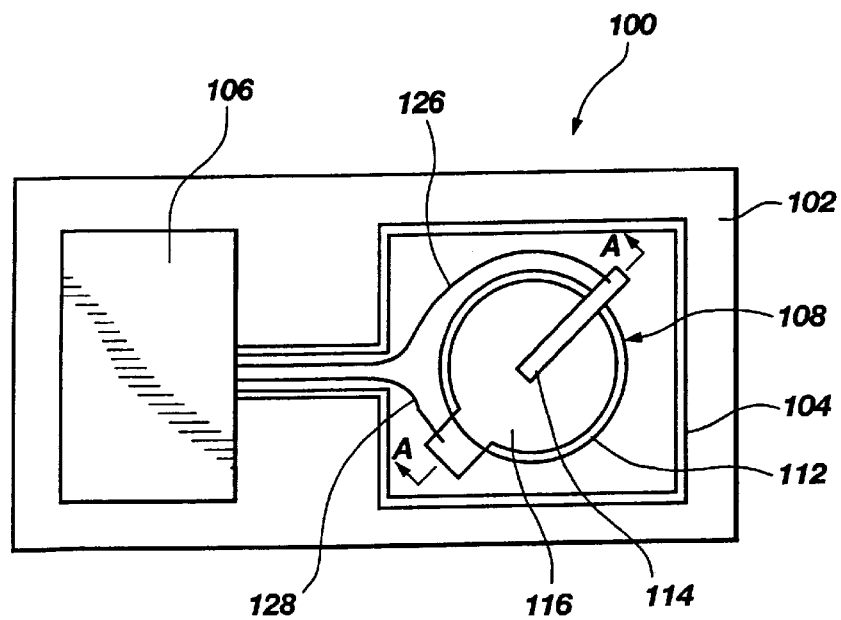
FIG. 1 illustrates a top plan view of a substrate of an active tag having a battery mounting contact according to the present invention.

FIG. 1 is an illustration of a preferred embodiment of an active tag 100 of the present invention. It should be understood that the figures presented in conjunction with this description are not meant to be actual cross-sectional views of any particular portion of an active tag, but are merely idealized representations which are employed to more clearly and fully depict the invention than would otherwise be possible.

The active tag 100 comprises a substrate 102, such as a printed circuit board or card, preferably a glass filled epoxy circuit board, having an antenna 104 attached thereto, which is used to receive and transmit RF signals to and from a base station (not shown). The antenna 104 connects to a circuitry component 106. The circuitry component 106 may comprise RF circuits, logic circuits, and memory.

Figure 2:
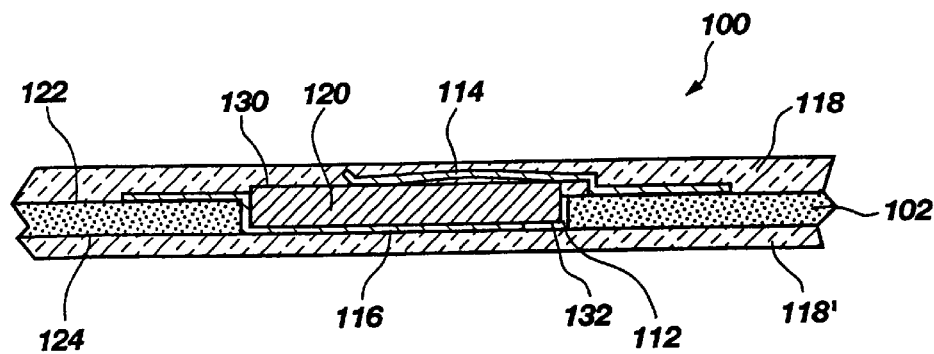
FIG. 2 illustrates a cross-sectional view of an embodiment of a battery mounting contact according to the present invention along line A—A of FIG. 1.

A battery mounting contact 108 is disposed in or substantially planarly adjacent to a battery cavity 112. FIG. 1 is illustrated without a battery within the battery mounting contact 108. Referring to FIG. 2 (a cross-sectional view of FIG. 1 along line A—A), the battery mounting contact 108 comprises a contact arm 114, a contact pad 116 and a battery 120 mounted between the contact arm 114 and the contact pad 116. The contact arm 114 is attached to a first surface 122 of the substrate 102 and extends over the battery cavity 112 substantially planarly adjacent to the substrate first surface 122. The contact pad 116 extends over the battery cavity 112 substantially planarly adjacent to a second surface 124 of the substrate 102. A first and second lamination layer of dielectric material or the like 118, 118' cover the first substrate surface 122 and the second substrate surface 124, respectively.

The contact arm 114 and the contact pad 116 are conductive and preferably made of metal, such as aluminum, aluminum alloys, copper, copper alloys, tin plated steel, and the like. As shown in FIG. 1, the contact arm 114 and the contact pad 116 are each in electrical communication with separate conductive traces 126, 128, respectively, which are, in turn, in electrical communication with the circuitry component 106 on the substrate 102. The contact arm 114 may be slightly bent in the form of a lead spring such that the vertical or transverse distance between the contact arm 114 and the contact pad 116 is smaller than the thickness of the battery 120. This results in the battery 120 being held firmly and resiliently between the contact arm 114 and the contact pad 116.

As shown in FIG. 2, the battery 120, having a first contact surface 130 and a second contact surface 132, is disposed within the battery cavity 112 between the contact arm 114 and the contact pad 116. The battery first contact surface 130 makes electrical contact with the contact arm 114 and the battery second contact surface 132 makes electrical contact with the contact pad 116. The battery first contact surface 130 may be an anode and the battery second contact surface 132 may be a cathode, or vice versa. The contact pad 116 is preferably designed in a size and shape to approximately match a surface area of the battery second contact surface (as shown in FIG. 1). This provides a sound mechanical support for the battery 120. The contact arm 114 is preferably thin to allow for easy insertion thereunder of the battery 120 into the battery cavity 112, but thick enough to have sufficient resiliency to firmly retain the battery 120 in the battery cavity 112.

FIG. 2 illustrates the substrate 102 having a thickness of about 31 mils (0.031 inches). The battery 120 is preferably a lithium coin cell 2016 battery, such as manufactured by Eveready®. The designation of "2016" stands for 20 mm in diameter and 1.6 mm thick (0.7874 inches in diameter and 0.063 inches thick). The contact arm 114 and contact pad 116 are each approximately 0.003 inches thick.

Figure 3:
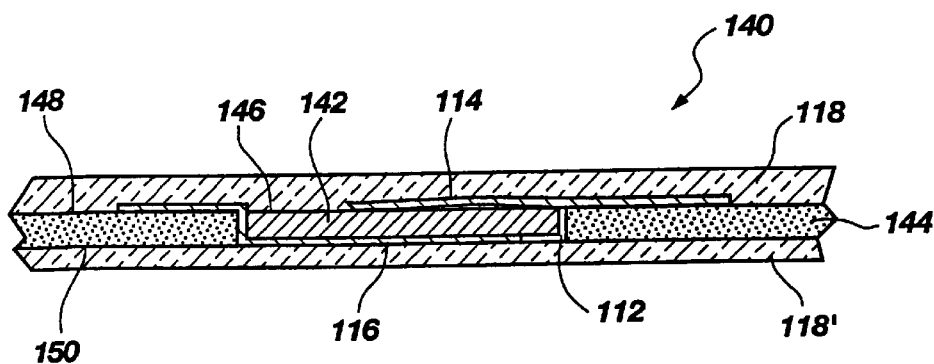
FIG. 3 illustrates a cross-sectional view of another embodiment of a battery mounting contact according to the present invention also along line A—A of FIG. 1.

FIG. 3 illustrates a thin active tag 140 which is similar to the active tag 100 of FIGS. 1 and 2. All elements in FIG. 3 which are common to FIGS. 1 and 2 retain the same numeric designation. The thin active tag 140 includes a thin profile battery 142. The thin profile battery 142 is preferably a lithium coin cell 2005 battery (20 mm (0.7874 inches) in diameter and 0.5 mm (0.0197 inches) thick). This results in the combined thickness of the thin profile battery 142 and the contact pad 116 being thinner than the substrate 102 shown in FIG. 2. Thus, a thin profile battery 142 allows for the use of a thin substrate 144 to make a first surface 146 of the battery 142 substantially flush with a first surface 148 of the thin substrate 144 and the contact pad 116 substantially flush with a second surface 150 of the thin substrate 144.

Figure 4:
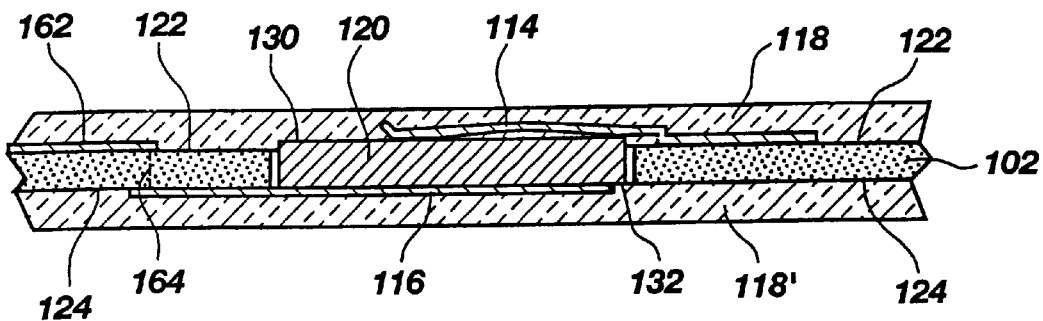
FIG. 4 illustrates a cross-sectional view of yet another embodiment of a battery mounting contact according to the present invention.

As shown respectively in FIGS. 2 and 3, the contact pad 116 may be attached to the substrate first surface 122, 148, wherein a portion of the contact pad 116 extends through the battery cavity 112 and aligns substantially planarly adjacent to the substrate second surface 124, 150. This configuration has the advantage of reducing the overall height of the active tag 100, 140 by the thickness of the contact pad 116 which would have been attached to the substrate second surface 124, 150. However, as shown in FIG. 4, when the overall thickness of the active tag is not critical, the contact pad 116 can be attached to the substrate second surface 124. All elements in FIG. 4 which are common to FIG. 2 retain the same numeric designation. The contact pad 116 is connected to a conductive trace 162 on the opposite side of the substrate 102 through a conductive via 164. The conductive trace 162 is in electrical communication with the circuitry component 106 (shown in FIG. 1).

Figure 5:
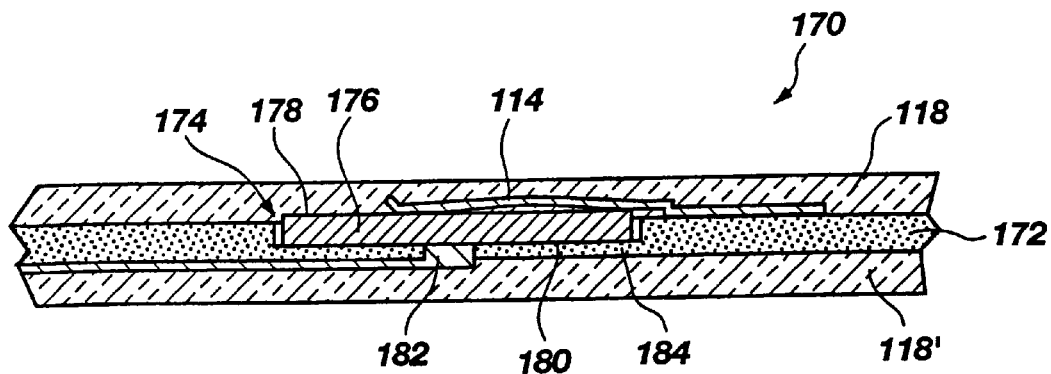
FIG. 5 illustrates a cross-sectional view of still yet another embodiment of a battery mounting contact according to the present invention.

FIG. 5 illustrates an active tag 170 having a substrate 172 with a battery cavity 174 which does not extend entirely through the substrate 172. A battery 176, having a first contact surface 178 and a second contact surface 180, is disposed within the battery cavity 174 between the contact arm 114 and a contact node 182 which extends through the bottom 184 of the battery cavity 174.

Figure 6:
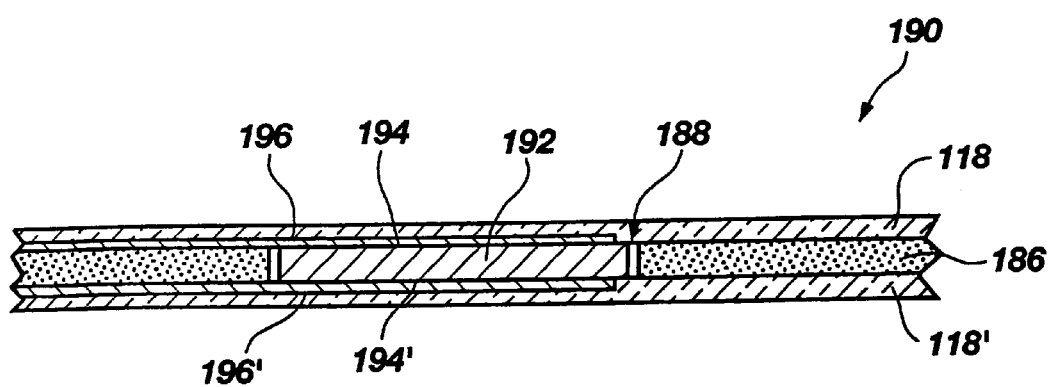
FIG. 6 illustrates a cross-sectional view of still another embodiment of a battery mounting contact according to the present invention.

FIG. 6 illustrates another embodiment of an active tag 190 having a substrate 186 with a battery cavity 188. A battery 192, having a first contact surface 194 and a second contact surface 194', is disposed within the battery cavity 188 between the contact arms 196, 196' which contact the first contact surface 194 and the second contact surface 194', respectively. This embodiment can be constructed by first attaching the contact arms 196, 196' to the lamination material 118, 118', respectively, then attaching one of the first or second battery contact surfaces 194, 194' to one of the contact arms 196, 196' and lamination material 118, 118'. The substrate 186 is placed over the battery 192, such that the battery cavity 188 fits over the battery 192. The other contact arm 196, 196' and lamination material 118, 118' is attached to the substrate 186 and the other of the first or second battery contact surfaces 194, 194'.

Figure 7:
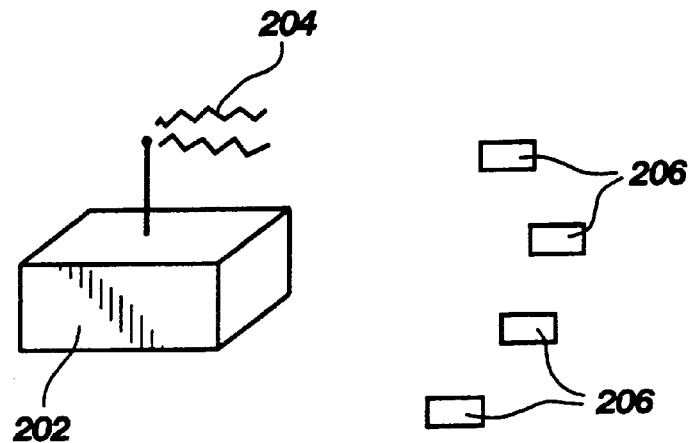
FIG. 7 illustrates an application of the active tags of the present invention with an RF transmitter/receiver.
Figure 8:
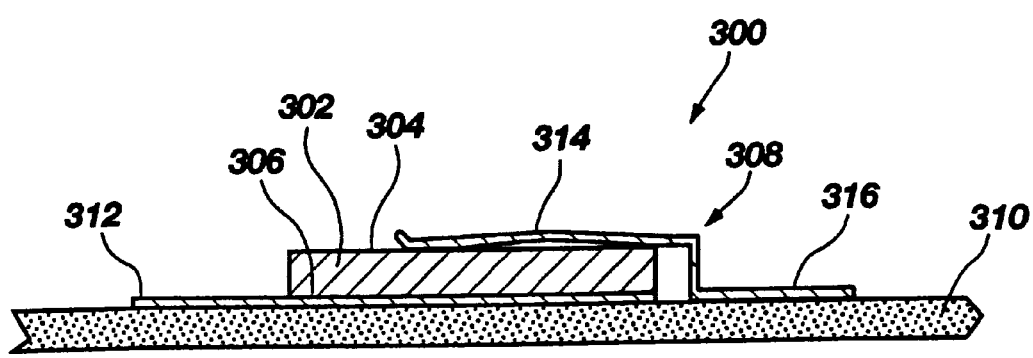
FIG. 8 illustrates a cross-sectional view of a prior art embodiment of a battery surface mounting contact.

FIG. 7 illustrates an application of the present invention wherein a base station 202 may transmit and receive RF signals 204 to information carrying tags 206. The information carrying tags 206 may retain, modify, and send information contained on the information carrying tags 206 in response to the base station: RF signals 204.

The embodiments disclosed above may, of course, be encased on one or both sides by a physical enclosure, such as an injection molded plastic encasement or by laminating an insulative sheet thereover.

Having thus described in detail preferred embodiments of the present invention, it is to be understood that the invention defined by the appended claims is not to be limited by particular details set forth in the above description as many apparent variation thereof are possible without departing from the spirit or scope thereof.

What is claimed is:

1. A battery mounting contact comprising:
   a substrate having a battery cavity defined therein;
   a substantially planar first contact attached to a first surface of said substrate and extending over said battery cavity substantially planarly adjacent to said substrate first surface; and
   a substantially planar second contact extending over said battery cavity, said substantially planar second contact substantially planarly adjacent to a second surface of said substrate.

2. The battery mounting contact of claim 1, wherein said substantially planar second contact is attached to said substrate first surface and extends through said battery cavity before extending thereover.

3. The battery mounting contact of claim 1, wherein said substantially planar first contact and said substantially planar second contact are each in electrical communication with separate conductive traces which are in electrical communication with circuitry on said substrate.

4. A battery assembly comprising:
   a substrate having a battery cavity defined therein;
   a substantially planar first contact attached to a first surface of said substrate and extending over said battery cavity substantially planarly adjacent to said substrate first surface;
   a substantially planar second contact extending over said battery cavity, said substantially planar second contact substantially planarly adjacent to a second surface of said substrate; and
   a battery, having a first contact surface and a second contact surface, disposed within said battery cavity between said substantially planar first contact and said substantial planar second contact, wherein said battery first contact surface electrically communicates with said substantially planar first contact and said battery second contact surface electrically communicates with said substantially planar second contact.

5. The battery assembly of claim 4, wherein said substantially planar second contact is attached to said substrate first surface and extends through said battery cavity before extending thereover.

6. The battery assembly of claim 4, wherein said substantially planar first contact and said substantially planar second contact are each in electrical communication with separate conductive traces which are in electrical communication with circuitry on said substrate.

7. An active radio frequency identification tag comprising:
   a substrate having a battery cavity defined therein;
   a substantially planar first contact attached to a first surface of said substrate and extending over said battery cavity substantially planarly adjacent to said substrate first surface;
   a substantially planar second contact extending over said battery cavity, said substantially planar second contact substantially planarly adjacent to a second surface of said substrate;
   a battery, having a first contact surface and a second contact surface, disposed within said battery cavity between said substantially planar first contact and said substantially planar second contact, wherein said battery first contact surface electrically communicates with said substantially planar first contact and said battery second contact surface electrically communicates with said substantially planar second contact;
   a circuitry component in electrical communication with said substantially planar first contact through a first electrical trace, and in electrical communication with said substantially planar second contact through a second electrical trace; and
   an antenna operationally engaged to said circuitry component.

8. The active radio frequency identification tag of claim 7, wherein said substantially planar second contact is attached to said substrate first surface and extends through said battery cavity before extending thereover.

9. The active radio frequency identification tag of claim 7, wherein said substantially planar first contact and said substantially planar second contact are each in electrical communication with separate conductive traces which are in electrical communication with circuitry on said substrate.

10. A battery mounting contact comprising:
a substantially planar substrate having two sides;
a battery cavity opening onto at least one side of said substrate;
a substantially planar first contact extending at least partially across said battery cavity adjacent one substrate side; and
a substantially planar second contact extending over at least partially across said battery cavity adjacent the other substrate side.

11. A method of fabrication of an active tag comprising:
providing a substrate having two surfaces, said substrate having circuitry and a battery cavity therein;
disposing a battery having two contact surfaces in said battery cavity;
contacting one battery contact surface with a substantially planar first contact adjacent one substrate surface; and
contacting the other battery contact surface with a substantially planar second contact adjacent the other substrate surface.

12. A radio frequency identification system comprising:
a base station for transmitting and receiving radio frequency signals; and
at least one active tag for receiving said radio frequency signals from said base station and for transmitting radio frequency signals to said base station, comprising:
a substrate having a battery cavity defined therein;
a substantially planar first contact attached to a first surface of said substrate and extending over said battery cavity substantially planarly adjacent to said substrate first surface; and
a substantially planar second contact extending over said battery cavity, said substantially planar second contact substantially planarly adjacent to a second surface of said substrate.

13. The radio frequency identification system of claim 15, wherein said substantially planar second contact is attached to said substrate first surface and extends through said battery cavity before extending thereover.

14. The radio frequency identification system of claim 12, wherein said substantially planar first contact and said substantially planar second contact are each in electrical communication with separate conductive traces which are in electrical communication with circuitry on said substrate.

15. The radio frequency identification system of claim 12, wherein said at least one active tag further comprises:
a battery, having a first contact surface and a second contact surface, disposed within said battery cavity between said substantially planar first contact and said substantially planar second contact, wherein said battery first contact surface electrically communicates with said substantially planar first contact and said battery second contact surface electrically communicates with said substantially planar second contact.

16. The radio frequency identification system of claim 15, wherein said at least one active tag further comprises:
a circuitry component in electrical communication with said substantially planar first contact through a first electrical trace, and in electrical communication with said substantially planar second contact through a second electrical trace; and
an antenna operationally engaged to said circuitry component.

17. A radio frequency identification system comprising:
a base station for transmitting and receiving radio frequency signals; and
at least one active tag for receiving i radio frequency signals from said base station and for transmitting radio frequency signals to said base station, comprising:
a substantially planar substrate having two sides;
a battery cavity opening onto at least one side of said substrate;
a substantially planar first contact extending at least partially across said battery cavity adjacent one substrate side; and
a substantially planar second contact extending over at least partially across said battery cavity adjacent the other substrate side.

18. A battery mounting contact comprising:
a substrate having a battery cavity defined therein;
a first contact attached to a first surface of said substrate and extending over said battery cavity substantially planarly adjacent to said substrate first surface; and
a second contact extending over said battery cavity, said second contact attached to a second surface of said substrate and extending over said battery cavity to align substantially planarly adjacent to said substrate second surface.

19. The battery mounting contact of claim 18, wherein said first contact and said second contact are each in electrical communication with separate conductive traces which are in electrical communication with circuitry on said substrate.

20. A battery assembly comprising:
a substrate having a battery cavity defined therein;
a first contact attached to a first surface of said substrate and extending over said battery cavity substantially planarly adjacent to said substrate first surface;
a second contact extending over said battery cavity, said second contact attached to a second surface of said substrate and extending over said battery cavity to align substantially planarly adjacent to said substrate second surface; and
a battery, having a first contact surface and a second contact surface, disposed within said battery cavity between said first contact and said second contact, wherein said battery first contact surface electrically communicates with said first contact and said battery second contact surface electrically communicates with said second contact.

21. The battery assembly of claim 20, wherein said first contact and said second contact are each in electrical communication with separate conductive traces which are in electrical communication with circuitry on said substrate.

22. An active radio frequency identification tag comprising:
a substrate having a battery cavity defined therein;
a first contact attached to a first surface of said substrate and extending over said battery cavity substantially planarly adjacent to said substrate first surface;
a second contact extending over said battery cavity, said second contact attached to and substantially planarly adjacent to a second surface of said substrate;
a battery, having a first contact surface and a second contact surface, disposed within said battery cavity between said first contact and said second contact, wherein said battery first contact surface electrically communicates with said first contact and said battery second contact surface electrically communicates with said second contact;
a circuitry component in electrical communication with said first contact through a first electrical trace, and in electrical communication with said second contact through a second electrical trace; and an antenna operationally engaged to said circuitry component.

23. The active radio frequency identification tag of claim 22, wherein said first contact and said second contact are each in electrical communication with separate conductive traces which are in electrical communication with circuitry on said substrate.

24. A battery mounting contact comprising:

a substantially planar substrate having two sides;

a battery cavity opening onto at least one side of said substrate;

a first contact extending at least partially across said battery cavity adjacent one substrate side; and a second contact extending over at least partially across said battery cavity, said second contact attached to and adjacent the other substrate side.

25. A method of fabrication of an active tag comprising:

providing a substrate having two surfaces, said substrate having circuitry and a battery cavity therein;

disposing a battery having two contact surfaces in said battery cavity;

contacting one battery contact surface with a first contact attached to and adjacent one substrate surface; and contacting the other battery contact surface with a second contact attached to and adjacent the other substrate surface.

26. A radio frequency identification system comprising:

a base station for transmitting and receiving radio frequency signals; and at least one active tag for receiving mid radio frequency signals from said base station and for transmitting radio frequency signals to said base station, comprising:
a substrate having a battery cavity defined therein;
a first contact attached to a first surface of said substrate and extending over said battery cavity substantially planarly adjacent to said substrate first surface; and
a second contact extending over said battery cavity, said second contact attached to a second surface of said substrate and extending over said battery cavity to align substantially planarly adjacent to said substrate second surface.

27. The radio frequency identification system of claim 26, wherein said first contact and said second contact are each in electrical communication with separate conductive traces which are in electrical communication with circuitry on said substrate.

28. The radio frequency identification system of claim 26, wherein said at least one active tag further comprises:

a battery, having a first contact surface and a second contact surface, disposed within said battery cavity between said first contact and said second contact, wherein said battery first contact surface electrically communicates with said first contact and said battery second contact surface electrically communicates with said second contact.

29. The radio frequency identification system of claim 28, wherein said at least one active tag further comprises:

a circuitry component in electrical communication with said first contact through a first electrical trace, and in electrical communication with said second contact through a second electrical trace; and an antenna operationally engaged to said circuitry component.

30. A radio frequency identification system comprising:

a base station for transmitting and receiving radio frequency signals; and at least one active tag for receiving said radio frequency signals from said base station and for transmitting radio frequency signals to said base station, comprising:
a substantially planar substrate having two sides;
a battery cavity opening onto at least one side of said substrate;
a first contact extending at least partially across said battery cavity adjacent one substrate side; and
a second contact extending over at least partially across said battery cavity adjacent the other substrate side.

* * * * *

UNITED STATES PATENT AND TRADEMARK OFFICE
CERTIFICATE OF CORRECTION

PATENT NO.    : 6,077,106
DATED         : June 20, 2000
INVENTOR(S)   : William Mish It is certified that error appears in the above-identified patent and that said Letters Patent is hereby corrected as shown below:

Title page,
Item [56], References Cited, U.S. PATENT DOCUMENTS, before "3/1987" insert -- * --; and insert -- * cited by examiner --
Item [57], ABSTRACT,
Line 10, change "vis" to -- vice --

Column 3,
Line 23, after "FIG. 1;" insert new paragrph indentation and spacing

Column 5,
Line 39, change "station:" to -- station --

Column 6,
Line 17, change "substantial" to -- substantially --

Column 8,
Line 1, change "i" to -- said --

Column 9,
Line 32, change "mid" to -- said --

Signed and Sealed this

Twenty-eighth Day of June, 2005

JON W. DUDAS
*Director of the United States Patent and Trademark Office*